(12) United States Patent
Anderson et al.

(10) Patent No.: US 12,476,111 B2
(45) Date of Patent: Nov. 18, 2025

(54) SELECTIVE AREA DIFFUSION DOPING OF III-N MATERIALS

(71) Applicant: The Government of the United States of America, as represented by the Secretary of the Navy, Arlington, VA (US)

(72) Inventors: Travis J. Anderson, Alexandria, VA (US); Mona A. Ebrish, Nashville, TN (US); Alan G. Jacobs, Rockville, MD (US); Karl D. Hobart, Alexandria, VA (US); Francis J. Kub, Arnold, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 215 days.

(21) Appl. No.: 18/193,862

(22) Filed: Mar. 31, 2023

(65) Prior Publication Data
US 2024/0120201 A1    Apr. 11, 2024

Related U.S. Application Data

(60) Provisional application No. 63/326,296, filed on Apr. 1, 2022.

(51) Int. Cl.
*H01L 21/225* (2006.01)
(52) U.S. Cl.
CPC .............................. *H01L 21/2258* (2013.01)
(58) Field of Classification Search
CPC ....... H01L 21/76858; H01L 21/38–388; H01L 21/22–228; H01L 21/041; H10D 84/0188
See application file for complete search history.

(56) References Cited

U.S. PATENT DOCUMENTS

| 8,518,808 | B2 | 8/2013 | Feigelson et al. | |
| 9,543,168 | B2 | 1/2017 | Feigelson et al. | |
| 2016/0211262 | A1* | 7/2016 | Jan | H10D 84/017 |
| 2018/0026128 | A1* | 1/2018 | Ebrish | H01L 21/265 |
| | | | | 257/77 |
| 2019/0341261 | A1* | 11/2019 | Feigelson | H01L 21/3245 |

OTHER PUBLICATIONS

Czernecki et al., "Hydrogen diffusion in GaN:Mg and GaN:Si," J. Alloy Comp. 747. 354 (2018).
J. Hite, "Influence of HVPE substrates on homoepitaxy of GaN grown by MOCVD," J. Cryst. Growth 498, 352 (2018).

* cited by examiner

*Primary Examiner* — Christine S. Kim
*Assistant Examiner* — Cole Leon Lindsey
(74) *Attorney, Agent, or Firm* — US Naval Research Laboratory; Jorie L. Stroup

(57) ABSTRACT

A technique for selective-area diffusion doping of III-N epitaxial material layers and for fabricating power device structures utilizing this technique. Dopant species such as Mg are introduced into the III-N material layer and are diffused into the III-N material by annealing under stable or metastable conditions. The dopant species can be introduced via deposition of a metal or alloy layer containing such species using sputtering, e-beam evaporation or other technique known to those skilled in the art. The dopant material layer is capped with a thermally stable layer to prevent decomposition and out-diffusion, and then is annealed under stable or metastable conditions to diffuse the dopant into the III-N material GaN without decomposing the surface.

20 Claims, 14 Drawing Sheets

Selective-Area Doping/Annealing
to Form P⁺ Areas in P-type Material

Dopant Diffusion
into P-type material
to Form P+ area

Prior Art - Selective-Area Etching

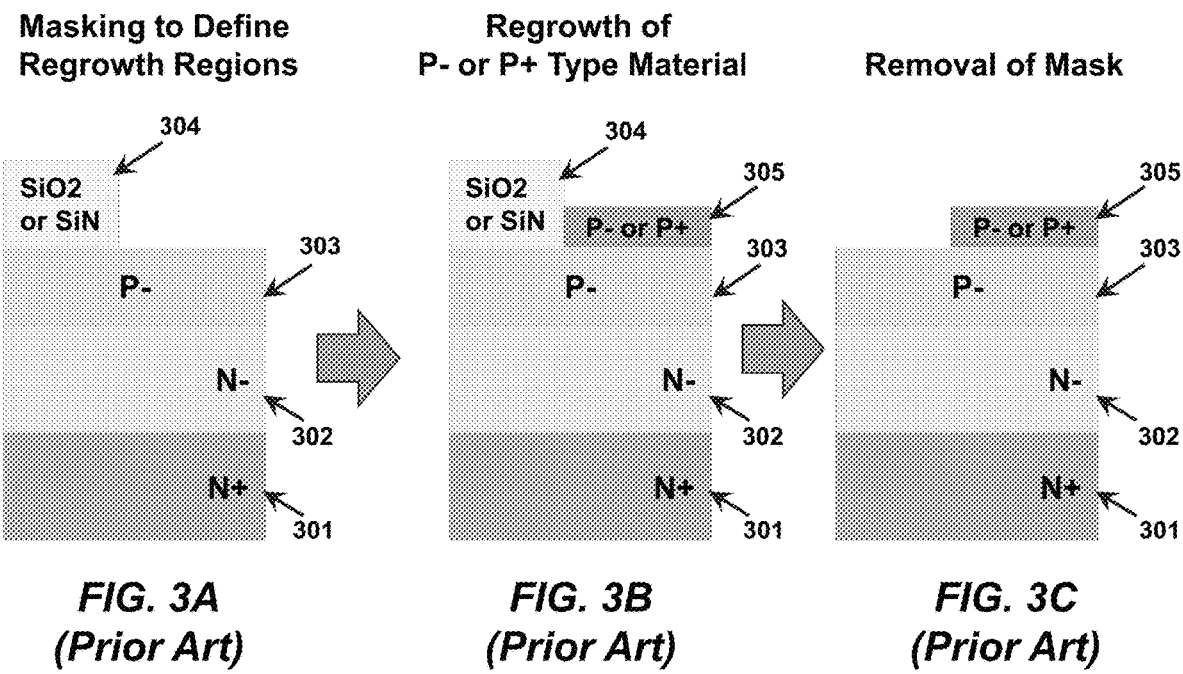
Prior Art – Selective-Area P-Type Regrowth
FIG. 3A (Prior Art) — Masking to Define Regrowth Regions
FIG. 3B (Prior Art) — Regrowth of P- or P+ Type Material
FIG. 3C (Prior Art) — Removal of Mask

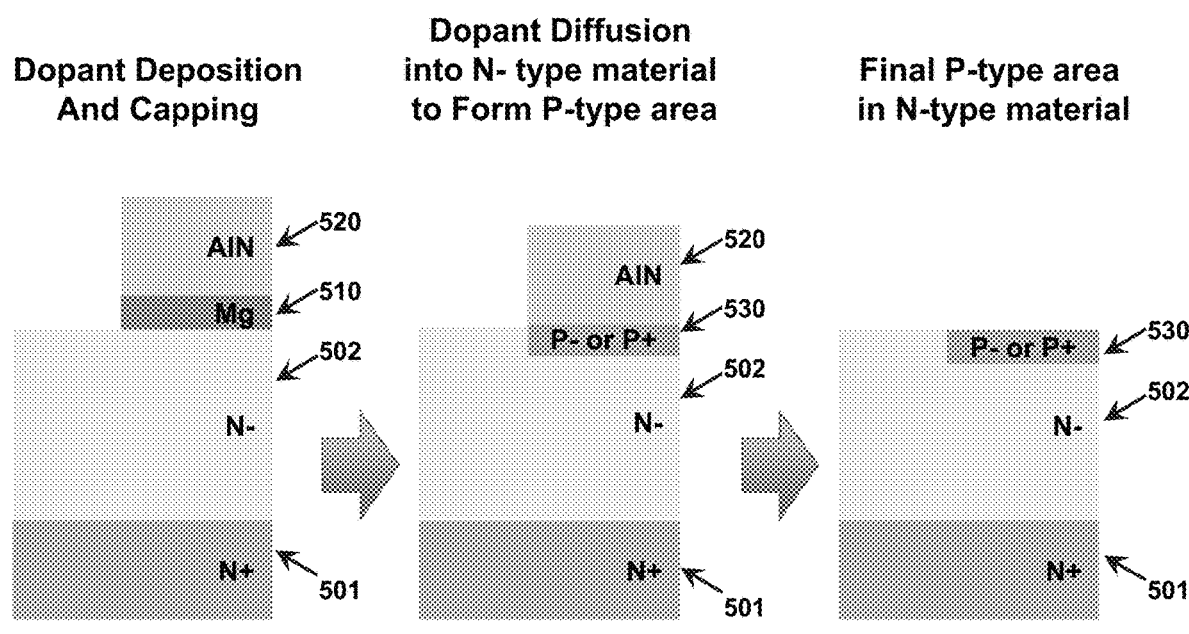

Selective-Area Doping/Annealing to Form P+ Areas in P-type Material

SELECTIVE AREA DIFFUSION DOPING OF III-N MATERIALS

CROSS-REFERENCE

This Application is a Nonprovisional of and claims the benefit of priority under 35 U.S.C. § 119 based on U.S. Provisional Patent Application No. 63/326,296 filed on Apr. 1, 2022. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #211994.

TECHNICAL FIELD

The present invention relates to doping of semiconductor materials, particularly to selective-area diffusion doping of III-N epitaxial films and substrates, as well as to fabricating power device structures utilizing this technique.

BACKGROUND

GaN and related wide- and ultrawide-bandgap III-N semiconductor alloys (e.g. AlGaN, InAlGaN, AN) have many favorable properties for power devices, notably the tunable direct bandgap (0.7-6.1 eV), high saturation velocity, high mobility, and high breakdown field. This material system exhibits a substantially improved Baliga Figure of Merit (BFOM) for power switching compared to conventional Si or SiC technology.

Technological challenges relating to such devices, such as reliable substrate production and doping control in drift layers suitable for high voltage (1-20 kV), are being resolved, enabling renewed commercial interest in vertical power device technology such as P-i-N diodes, junction barrier Schottky (JBS) diodes, P-N junction gated field effect transistors (JFET), current aperture vertical electron transistors (CAVET), double diffused metal oxide semiconductor field effect transistors (DMOS), and trench MOSFET devices.

Having heavily doped regions in the P- or N-type regions is required to obtain ohmic contact resistance to the III-N epitaxial layers in such devices. However, in order to obtain useful devices, the doping must also be in only selected areas and with a shallow depth of the doping profile. However, significant technical challenges remain in selective-area doping technology to achieve complex high performance device structures without numerous etch and regrowth steps; such steps are not planar and are known to introduce undesired impurities at regrowth interfaces as well as reduced material quality. See Czernecki et al., "Hydrogen diffusion in GaN:Mg and GaN:Si," *J. Alloy Comp.* 747. 354 (2018); and J. Hite, "Influence of HVPE substrates on homoepitaxy of GaN grown by MOCVD," *J. Cryst. Growth* 498, 352 (2018).

In conventional power semiconductor device technologies such as those based on Si and SiC, dopant species are selectively introduced in specified areas by either ion implantation or diffusion into the semiconductor from a solid source.

Typical device structures are illustrated in FIGS. 1A and 1C. In the device structure illustrated in FIG. 1A, the device includes an N- layer 102 disposed on a N+ layer 101, with a P- layer 103 disposed on the N- layer and contacts 104a/104b disposed on the P- layer, while the device structure illustrated in FIG. 1C includes a very thin, heavily doped P+ layer 105 formed on P- layer 103, with the contacts 104a/104b being formed on the P+ layer. As can be seen from the curvature of the IV lines in FIG. 1B corresponding to the device structure in FIG. 1A, contacts 104a/104b are non-ohmic, while the IV curves shown in FIG. 1D corresponding to the device structure in FIG. 1C, are linear, indicating that improved ohmic contact is obtained with the addition of a P+ layer such as P+ layer 105 in the structure.

The block schematic in FIG. 2A illustrates a prior art structure having localized P+ contact regions 205a/205b formed by etching away portions of a blanket P+ layer such as P+ layer 105 shown in FIG. 1C. However, as the "Cl$_2$+Ar Etch" plotline in FIG. 2B shows, the current/voltage performance provided by the contacts formed on etched P+ contact regions 205a/205b is not as effective or linear as is the performance provided by the contacts formed on a continuous or "As-grown" P+ material layer due to damage to the P+ material caused by the etching process. Even after a surface cleanup treatment (plotline labeled "Cl2+Ar Etch+ TMAH Treatment"), good electrical behavior of the device cannot be fully obtained.

The block schematics in FIGS. 3A-3C illustrate aspects of another process for selective area doping by means of selective area regrowth in accordance with the prior art. In the method illustrated in FIGS. 3A-3C, a structure comprising N+ layer 301, N- layer 302, and P- layer 303 as described above with respect to FIG. 1A is masked off, e.g., with SiO$_2$ or SiN 304 or some other suitable material, on a portion of the upper surface of the P- layer 303. As shown in FIG. 3B, a P- or P+ contact area 305 is then grown on an the unmasked portion of the upper surface of the P- layer 303. The SiO2 (or SiN) mask 305 is then removed, leaving the regrown P- (or P+) area 305 behind, as shown in FIG. 3C.

The plots in FIGS. 4A-4C show the shortcomings of devices grown by selective area regrowth such as is shown in FIGS. 3A-3C. As shown by the plots in FIGS. 4A and 4B, in the case of selective area regrowth via Plasma-Assisted Molecular Beam Epitaxy (PAMBE) (FIG. 4A) the annealing/exposure of an initially activated material to the growth environment introduces hydrogen into a magnesium doped layer, thereby electrically deactivating the magnesium, which is harmful to device operation. Similarly, the plot in FIG. 4C shows that for regrowth via Metal-Organic Chemical Vapor Deposition (MOCVD) instead of PAMBE, there is an unintentional and deleterious spike of silicon at the regrowth interface between the substrate and regrown material, which can also degrade device performance.

In these conventional structures, dopants are placed in contact with the surface either by direct deposition or utilizing paper-based sources containing the dopant species. Following this step, an anneal is performed at elevated temperature. The dopant species diffuse from the semi-infinite source following well-defined classical equations. Following initial coating of the semiconductor surface with the dopant-containing material, the species are further diffused into the semiconductor as a limited source in the "drive-in" anneal, also following well-defined classical equations. The desired dopant profiles are achieved by careful control of the time and temperature for multiple anneal cycles. Alternatively, the initial deposition of dopant species is achieved by ion implantation, followed by a drive-in anneal. Selective-area doping is achieved by using a combination of photomasks, dielectric masks, and metals to control the location of dopant species. Many years of technology development have realized variants on these processes for precise junction depth control.

However, the III-N material system presents several unique challenges, making the selective-area doping challenging. Most notably, control over P-type doping in general is difficult due to the high ionization energy of Mg and the known tendency to form electrically inactive complexes with other residual impurities such as hydrogen. Second, selective-area doping by ion implantation is extremely challenging and requires annealing at high temperature and elevated pressure to be successful. This is due to the high temperatures required to repair lattice damage from ion implantation as well as drive dopant species to the appropriate substitutional lattice site. Such high-temperature annealing can, however, damage the crystal or cause decomposition of the crystal into its constituent elements.

To mitigate such decomposition, annealing often is performed in a pressurized environment. Multicycle rapid thermal annealing (MRTA), symmetric multicycle rapid thermal annealing (SMRTA), and related annealing profiles and capping layers have been developed at the Naval Research Laboratory to mitigate these effects and enable dopant activation for P-N junction formation. See U.S. Pat. No. 8,518,808 to Feigelson et al., "Defects Annealing and Impurities Activation in III-Nitride Compound Semiconductors" and U.S. Pat. No. 9,543,168 to Feigelson et al., "Defects Annealing and Impurities Activation in Semiconductors at Thermodynamically Non-Stable Conditions."

However, limitations on ion implantation technology, combined with known diffusivity of Mg species, make the formation of highly doped near-surface layers difficult. Simultaneously, it is well known that the presence of thin (<30 nm), heavily doped surface layers (>1E19), is critical to low resistance ohmic contact formation, particularly for P-type material and associated metallization.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a technique for selective-area doping of III-N epitaxial films and substrates, as well as fabricating power device structures utilizing this technique. This approach is based on diffusion of dopant species into a base material layer by annealing under stable or metastable conditions. The dopant species can be introduced via deposition of a metal or alloy dopant material layer by means of sputtering, e-beam evaporation or other technique known to those skilled in the art, where the dopant material layer contains the dopant species to be diffused into predefined, patterned areas of the III-N material. The dopant material layer is capped with a thermally stable layer to prevent decomposition and out-diffusion. The III-N material with the capped dopant material layer is then annealed under stable or metastable conditions to diffuse the dopants into the predefined areas of the III-N material without decomposing the surface of the doped areas.

In an exemplary embodiment, acceptor dopants can be diffused into an N− type material layer to a depth of about 20 nm with a dopant concentration of $10^{16}$ to $10^{21}$ cm$^{-3}$ to form diffused P-N junctions comprising predefined areas of P+ type material within the N− type material layer.

In another exemplary embodiment, acceptor dopants can be diffused into a P-type material to a depth of about 20 nm with a dopant concentration of $10^{19}$ to $10^{21}$ cm$^{-3}$ to form P+ areas suitable for the formation of ohmic contacts, where the presence of the P+ material under the contacts provides better device performance.

BRIEF DESCRIPTION OF THE DRAWINGS

FIGS. 3A-3C illustrate aspects of a selective-area regrowth approach to doping a III-N device structure and forming ohmic contacts in accordance with the prior art.

FIGS. 5A-5C are block schematics illustrating aspects of a method for selective-area diffusion doping to form P+ material areas within an N− type material in accordance with the present invention.

DETAILED DESCRIPTION

Figure 1A:
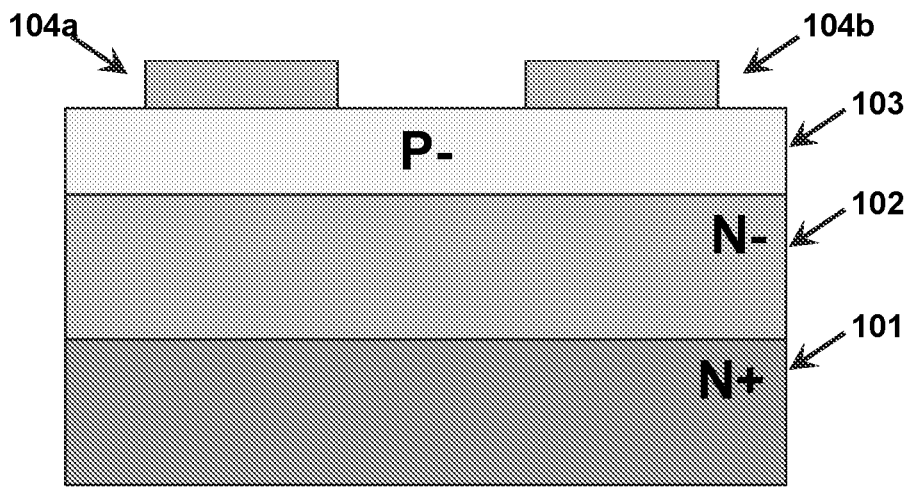
FIGS. 1A-1D illustrate aspects of conventional III-N device structures having selective-area ohmic contacts in accordance with the prior art.
Figure 1B:
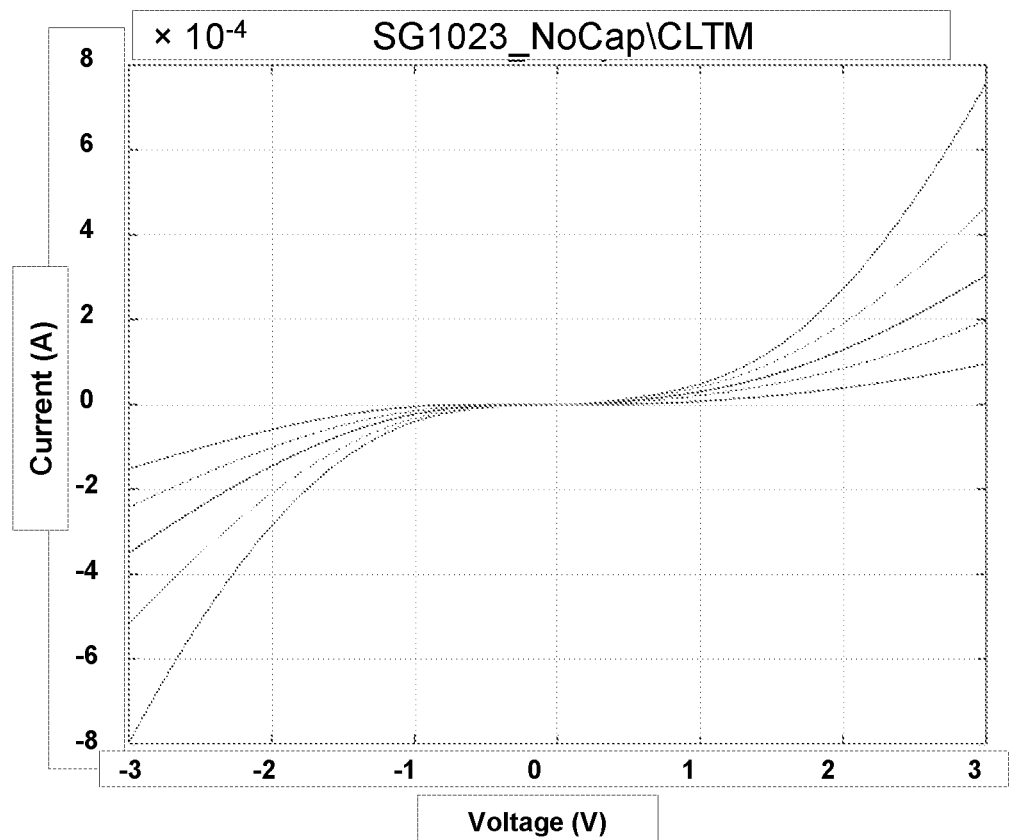
Figure 1C:
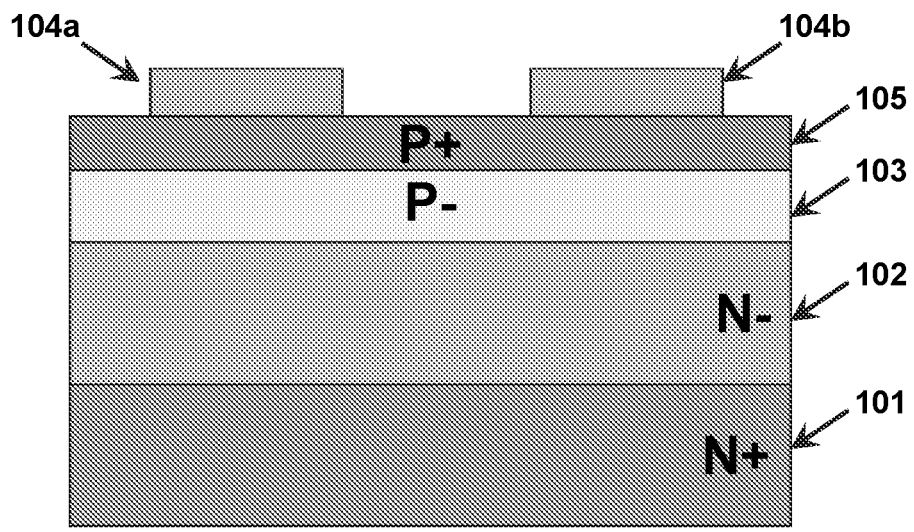
Figure 1D:
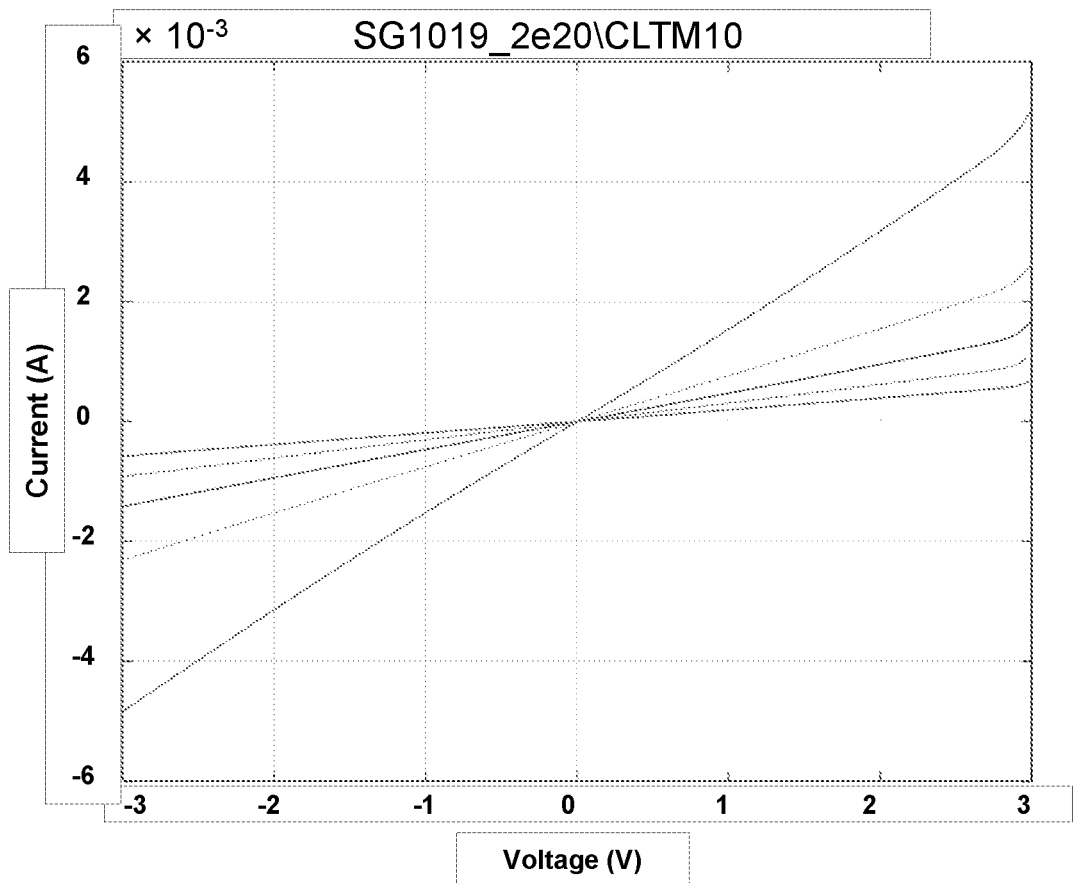
Figure 2A:
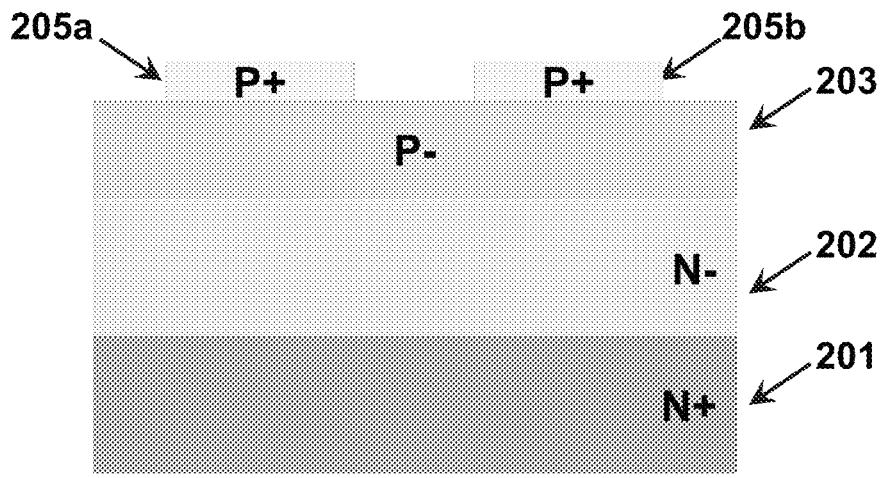
FIGS. 2A-2B illustrate aspects of a selective-area etching approach to doping a III-N device structure and forming ohmic contacts in accordance with the prior art.
Figure 2B:
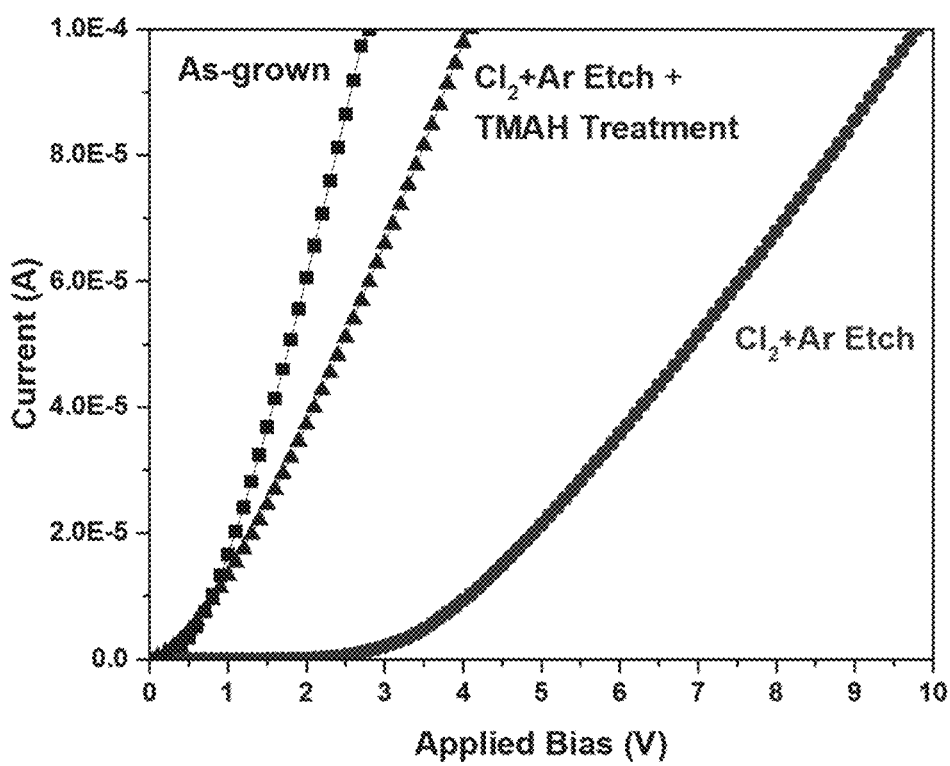
Figure 4A:
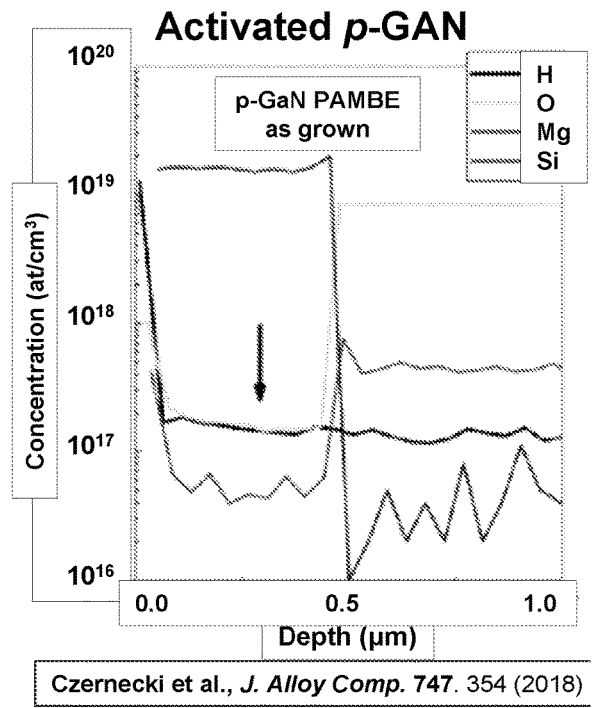
FIGS. 4A-4C are plots illustrating the doping limitations of devices formed by the selective-area regrowth approach shown in FIGS. 3A-3C.
Figure 4B:
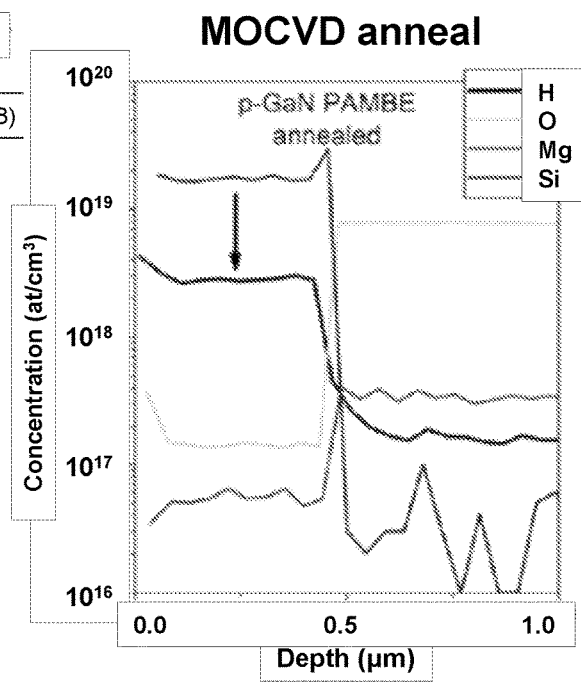
Figure 4C:
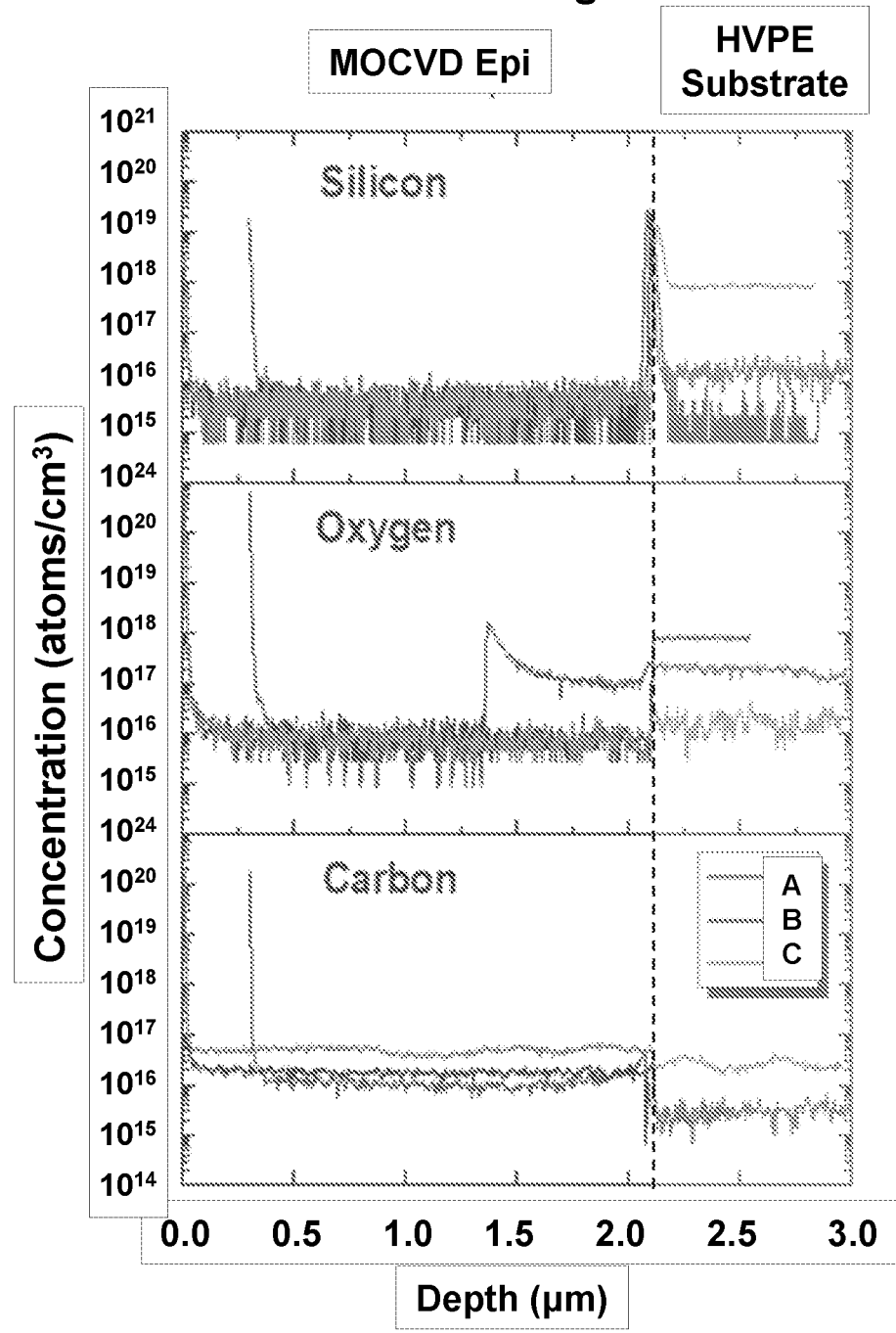

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a technique for selective-area doping of III-N epitaxial films and substrates, as well as fabricating power device structures utilizing this technique.

This approach is based on diffusion of dopant species into a base material layer by annealing under stable or metastable conditions. The dopant species can be introduced via deposition of a metal or alloy dopant material layer by means of sputtering, e-beam evaporation or other technique known to those skilled in the art, where the dopant material layer contains the dopant species to be diffused into predefined, patterned areas of the III-N material. The dopant material layer is capped with a thermally stable layer to prevent decomposition and out-diffusion. The III-N material with the capped dopant material layer is then annealed under stable or metastable conditions to diffuse the dopants into the predefined areas of the III-N material without decomposing the surface of the doped areas.

In an exemplary embodiment, acceptor dopants can be diffused into an N− type material layer to a depth of a few nm to greater than 50 nm with a dopant concentration of $10^{16}$ to about $10^{21}$ cm$^{-3}$ to form diffused P-N junctions comprising predefined areas of P− or P+ type material within the N− type material layer.

In another exemplary embodiment, acceptor dopants can be diffused into a P-type material to a depth of a few nm to greater than 50 nm with a dopant concentration of $10^{19}$ to about $10^{21}$ cm$^{-3}$ to form P+ areas suitable for the formation of ohmic contacts, where the presence of the P+ material under the contacts provides better device performance.

Selective area doping by diffusion in accordance with the present invention enables a low-damage process of introducing dopants to the III-N material. During diffusion, solute atoms or dopants move into the III-N material by exchanging with some of the III-N atoms and taking their place in the lattice. In contrast, ion implantation bombards the host III-N surface with high energy ions of the desired solute atoms simultaneously introducing the atoms and significant lattice damage and III-N atomic displacements which must be healed via annealing. The damage with ion implantation may also form unintended and deleterious complexes of atoms during and after the implantation and annealing process. Furthermore, selective area regrowth or etching are inherently and significantly non-planar and potentially introduce unintended doping species or defect states. In contrast, diffusion involves no inherently damaging process like ion implantation and uses the virgin material without additional or new interfaces unlike regrowth or etching.

Thus, as described in more detail below, in accordance with the present invention, heavily P-doped surface layers can be produced in N− or P-type III-N material by a process that includes the steps of (1) depositing material layer containing a metallic dopant source such as Mg on the upper surface of the N− or P-type material layer; (2) capping the deposited material in-situ with a thermally stable material such as AN or SiN or with a metal stack such as Pd, Pt, Au, or Ni; and (3) annealing the capped dopant material layer under stable or metastable conditions to diffuse the Mg into the N− or P-type material without decomposing its surface.

The block schematics in FIGS. 5A-5C illustrate aspects of a method for diffusion doping to selectively produce areas of P+ material within N− type material in accordance with the present invention.

As shown in FIG. 5A, in an exemplary embodiment in accordance with the present invention, a dopant source film 510 such as a thin Mg-containing film is selectively deposited on one or more predetermined areas of an upper surface of an N− material layer 502. Masking or any other suitable techniques can be used to pattern the surface and ensure that the dopant species is in contact only with the specified areas intended for selective-area diffusion doping. The thus-applied dopant source film 510 is then capped with a thermally stable layer such as AN layer 520 to prevent decomposition and out-diffusion of the Mg from the dopant source film 510 during annealing. In a typical embodiment, the Mg dopant source film 510 and the AN capping layer 520 are deposited by sputtering or e-beam evaporation, but any suitable deposition technique can be used.

Once it is deposited, the Mg from dopant source film 510 readily diffuses into N− material 502. In a second step, illustrated by the block schematic in FIG. 5B, following the initial deposition of the Mg in the specified areas of the N− material, the AlN− capped Mg film is annealed to further drive the Mg dopants into the surface of N− layer 502 to form P+ area 530 within the N− layer. Annealing can be accomplished by any suitable technique, though in many cases the multicycle rapid thermal annealing (MRTA) and symmetric multicycle rapid thermal annealing (SMRTA) techniques developed at the Naval Research Laboratory is preferred because it permits the annealing of GaN without damaging its surface. See U.S. Pat. No. 8,518,808 supra and U.S. Pat. No. 9,543,168 supra. Annealing may be conducted as a rapid thermal anneal for approximately 1-100 minutes at temperatures above 700° C. with or without one or multiple durations at high temperatures such as in MRTA where annealing can take place at temperatures of 1200 to 1600° C. for short periods of less than a minute each.

Following the annealing the thus-doped material, as illustrated in FIG. 5C, in many embodiments, AlN capping layer 520 and any residual Mg material remaining on the surface can be removed by means of any suitable technique such as chemical etching, with electrodes being deposited on the doped regions in order to make electrical contact to the doped regions. In other embodiments, the AlN capping layer 520 is not removed but instead is used as an electrode.

The design of the doped region can be determined by any suitable means, such as temperature and time annealing profiles known to those skilled in the art, so that the P-type regions produced by the diffusion and annealing process in accordance with the present invention can have a predefined depth and dopant concentration within the base III-N material. The depth of the diffusion-doped regions formed in accordance with the method of the present invention is typically less than 10 times the thickness of the initial source film but can be tuned by selection of the annealing temperature and time to be, e.g., ultra-shallow, on the order of 10 nm; have a typical thickness similar to growth based contact layers, on the order of 10-50 nm; or be deep, having a depth of e.g., greater than 50 nm, with a dopant concentration of between $10^{16}$ and $10^{21}$ cm$^{-3}$.

Figures 6A, 6B, 6C:
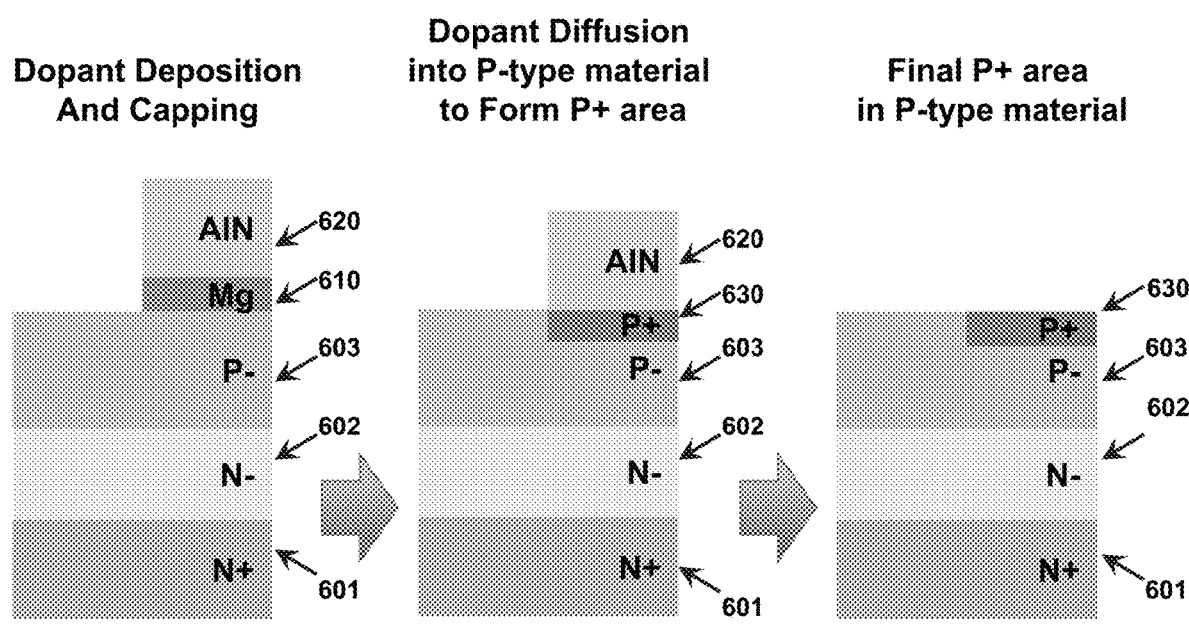
FIGS. 6A-6C are block schematics illustrating aspects of a method for selective-area diffusion doping to form P+ material areas within a P-type material in accordance with the present invention.

In other embodiments, the diffusion doping method in accordance with the present invention can be used to form P+ areas at the surface of P-type material layers, as illustrated in the block schematics shown in FIGS. 6A-6C. Thus, as shown in FIG. 6A, a P-type dopant source such as a Mg-containing dopant source layer 610 is applied to a III-N material structure containing N+ layer 601, N− layer 602, and P-layer 603, with dopant source layer being capped by AlN cap 620 in a manner described above. The structure with the thus-capped dopant source layer is then annealed to diffuse the Mg from dopant source layer 610 predefined areas of P-layer 603 to form P+ areas 630 within the P-layer 603, as shown in FIG. 6B. Finally, as shown in FIG. 6C, the AlN cap 620 is removed, leaving the P+ areas 630 suitable for the formation of ohmic or other contacts thereon. As with the formation of P− type areas within N− type material described above, the depth and dopant concentration of the doped areas can be tailored by means of suitable temperature and time annealing profiles to obtain doped areas having a predefined depth and P-type dopant concentrations within the P-type material of $10^{19}$ to $10^{21}$ cm$^{-3}$.

Figure 7A:
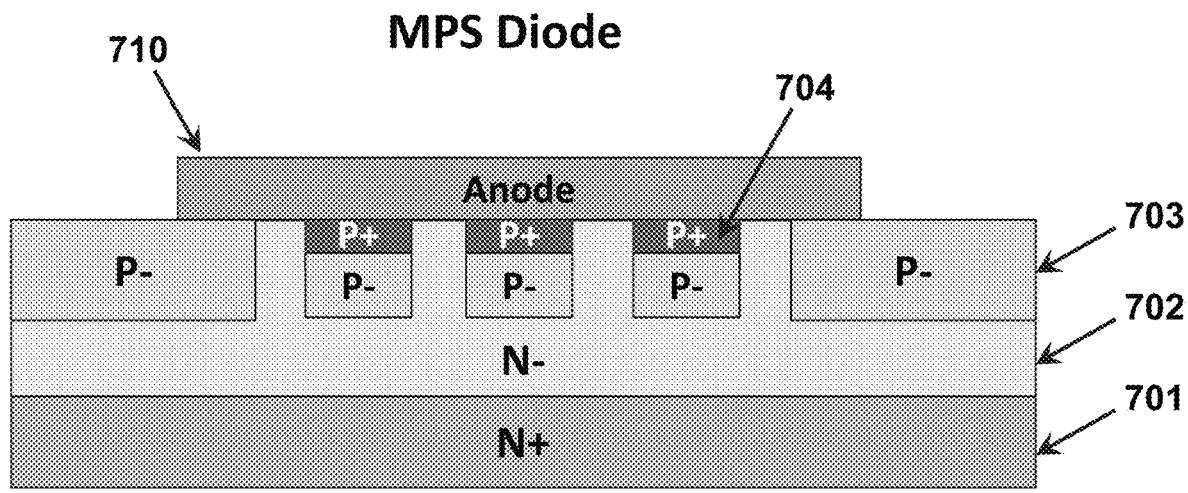
FIGS. 7A and 7B are block schematics illustrating aspects of exemplary MPS (FIG. 7A) and JBS (FIG. 7B) devices that can be fabricated using the method for selective-area diffusion doping in a III-N device structure in accordance with the present invention.
Figure 7B:
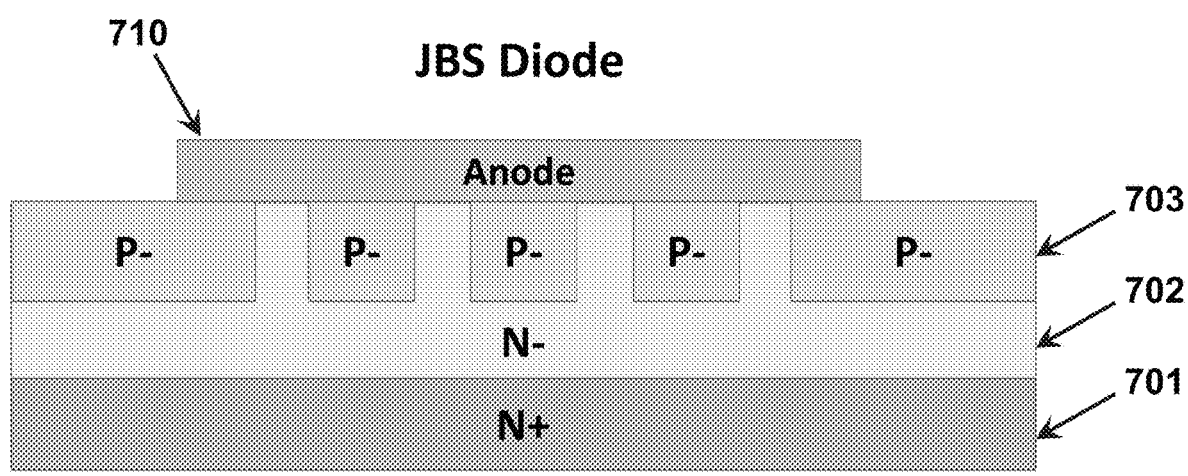

The method of the present invention can be used for edge termination or contact formation in any vertical or lateral device structure such as a merged P-i-N Schottky (MPS) diode such as that illustrated by the block schematic in FIG. 7A or a junction barrier Schottky (JBS) diode such as that illustrated by the block schematic in FIG. 7B.

Thus, an MPS diode such as that illustrated by the block schematic in FIG. 7A can be formed, where the diode includes N+ layer 701 and N− layer 702 disposed on the N+ layer, with multiple P-type areas 703 formed in N− layer 702 by means of conventional ion-implantation and shallow P+ material layers 604 formed on the upper surface of the P-type areas by means of the selective-area diffusion techniques in accordance with the present invention. Anode 710 is formed on an upper surface of the structure, where contact 710 is ohmic where it contacts the P+ areas 704 and non-ohmic where it contacts the N− material 702 and the P-type material 703. The presence of ohmic contact in the device as a result of the presence of the P+ areas provides improved contact resistance and improved current-voltage response.

Similarly, a JBS diode having a structure such as that illustrated in FIG. 7B can include an N+ layer 701 and an N− layer 702 disposed on the N+ layer, with multiple predefined P-type areas 703 formed in the N+ layer by the diffusion doping method of the present invention. Anode 710 contacts both N− type material 702 and P-type material 703 and, as with the contact in the MPS diode described above, the presence of both the N− type and P-type material under contact 710 provides improved contact resistance and improved current-voltage response.

Other devices such as P-N junction gated field effect transistors (JFETs), current aperture vertical electron transistors (CAVETs), double diffused metal oxide semiconductor field effect transistors (DMOS), and trench MOSFET devices can also be fabricated utilizing the selective area doping techniques in accordance with the present invention.

All of these devices can be fabricated utilizing diffused selectively doped regions alone or utilizing a combination of ion implantation for deep junction formation and diffusion for low resistance contact regions. Selective-area Mg diffusion can also be used in conjunction with P-GaN epitaxial layers to form low resistance ohmic contacts without the need for P++ epitaxial layers which have to be etched outside the contact regions.

Figure 8:
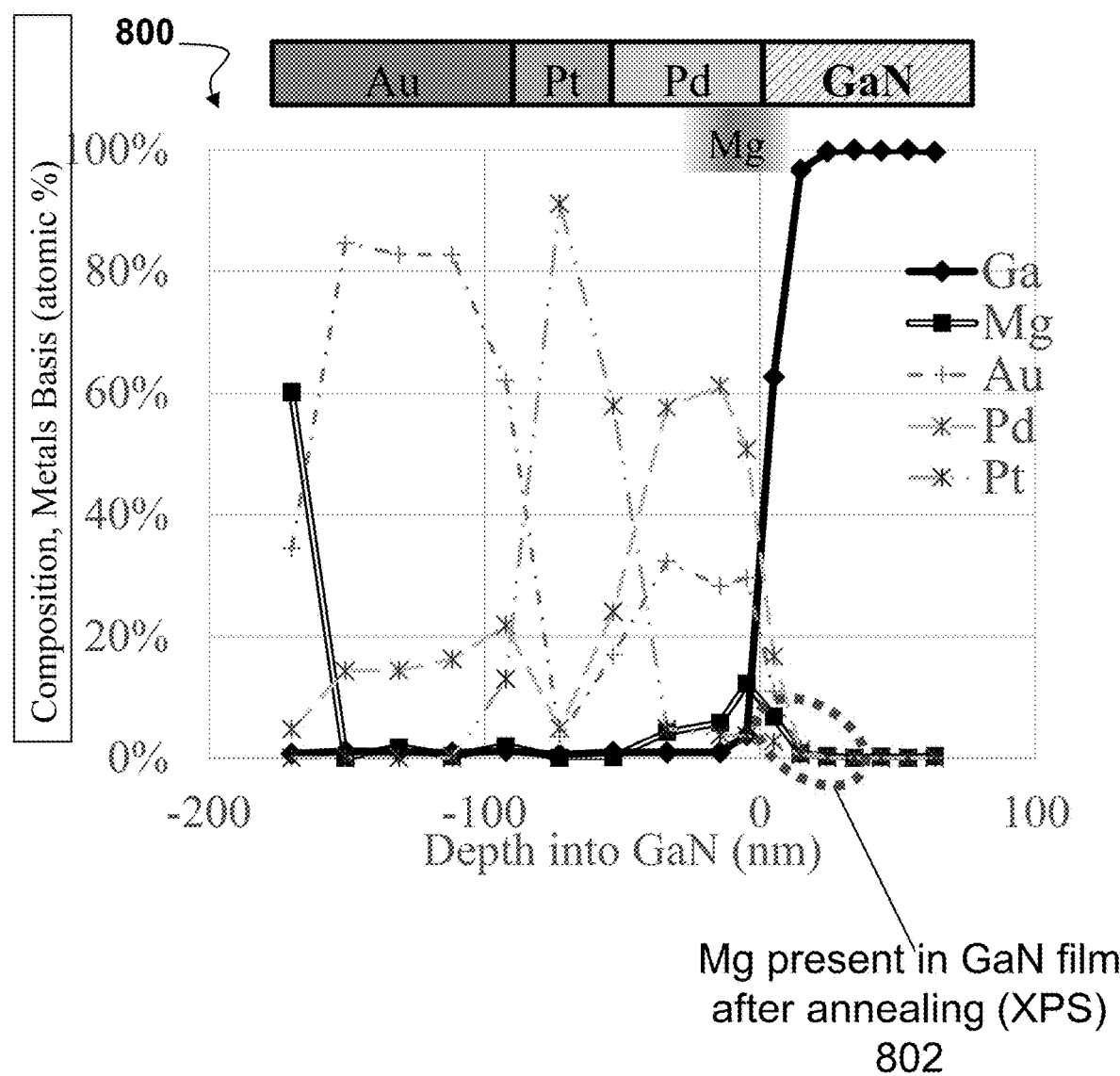
FIG. 8 is a plot illustrating characteristics of a GaN material film after selective-area deposition and annealing of Mg dopants in accordance with the present invention.

The plot 800 in FIG. 8 depicts the results of X-ray Photoelectron Spectroscopy (XPS) analysis of a GaN material pad containing Au, Pt, and Pd having Mg deposited at the surface, and shows the material composition (approximate atomic %) as the material is annealed and the Mg diffuses into the underlying III-N material, in this case GaN. At 802, FIG. 8 depicts the presence of Mg in GaN film after annealing (XPS). FIG. 8 shows that as a function of analysis etch time into the material, beneath the Au/Pt/Pd metal pad, Mg has diffused into the top surface of the GaN, while a minimal amount has been retained in the metal. After 1200 seconds s of analysis etch time, there is a clear increase in Mg within the GaN layer.

Figure 9A:
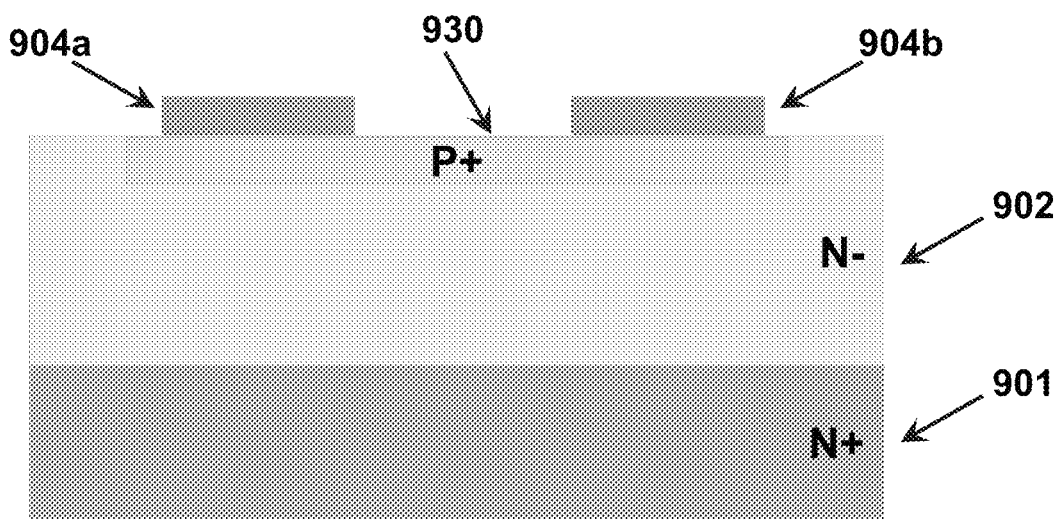
FIGS. 9A and 9B illustrate aspects of an exemplary semiconductor device having selective-area diffusion doping in accordance with the present invention.
Figure 9B:
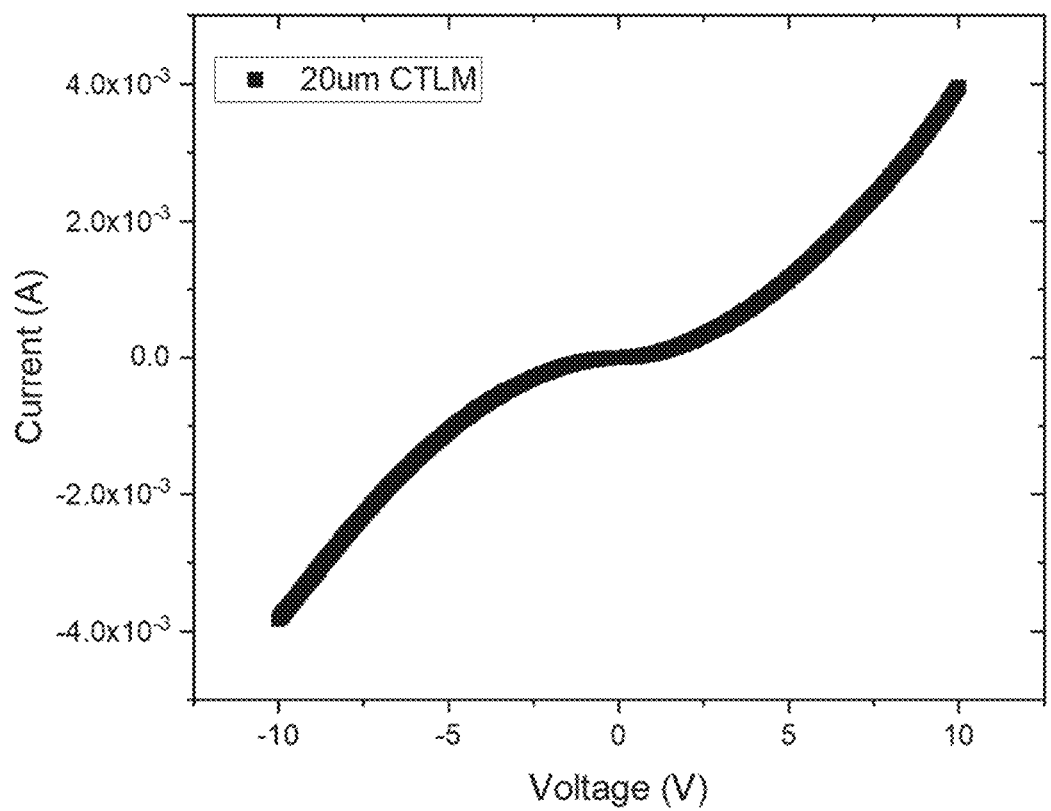

FIGS. 9A and 9B illustrate aspects of an exemplary transmission line measurement of a simple resistor device having a selectively defined P+ doped area 930 within an N− material layer 902, with electrodes 904a/904b formed on the P+ doped area as shown in FIG. 9A. As shown by the current-voltage plot in FIG. 9B, the P+ layer shows nearly ohmic behavior across a large voltage range from selective area doping via diffusion.

Figure 10A:
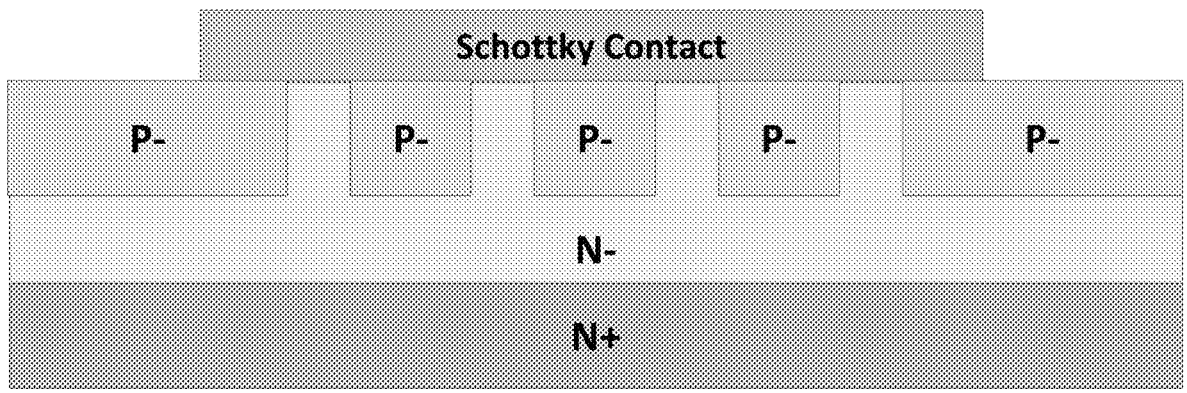
FIGS. 10A-10C illustrate aspects of an exemplary MPS diode having P+ areas formed by selective-area diffusion doping in accordance with the present invention.
Figure 10B:
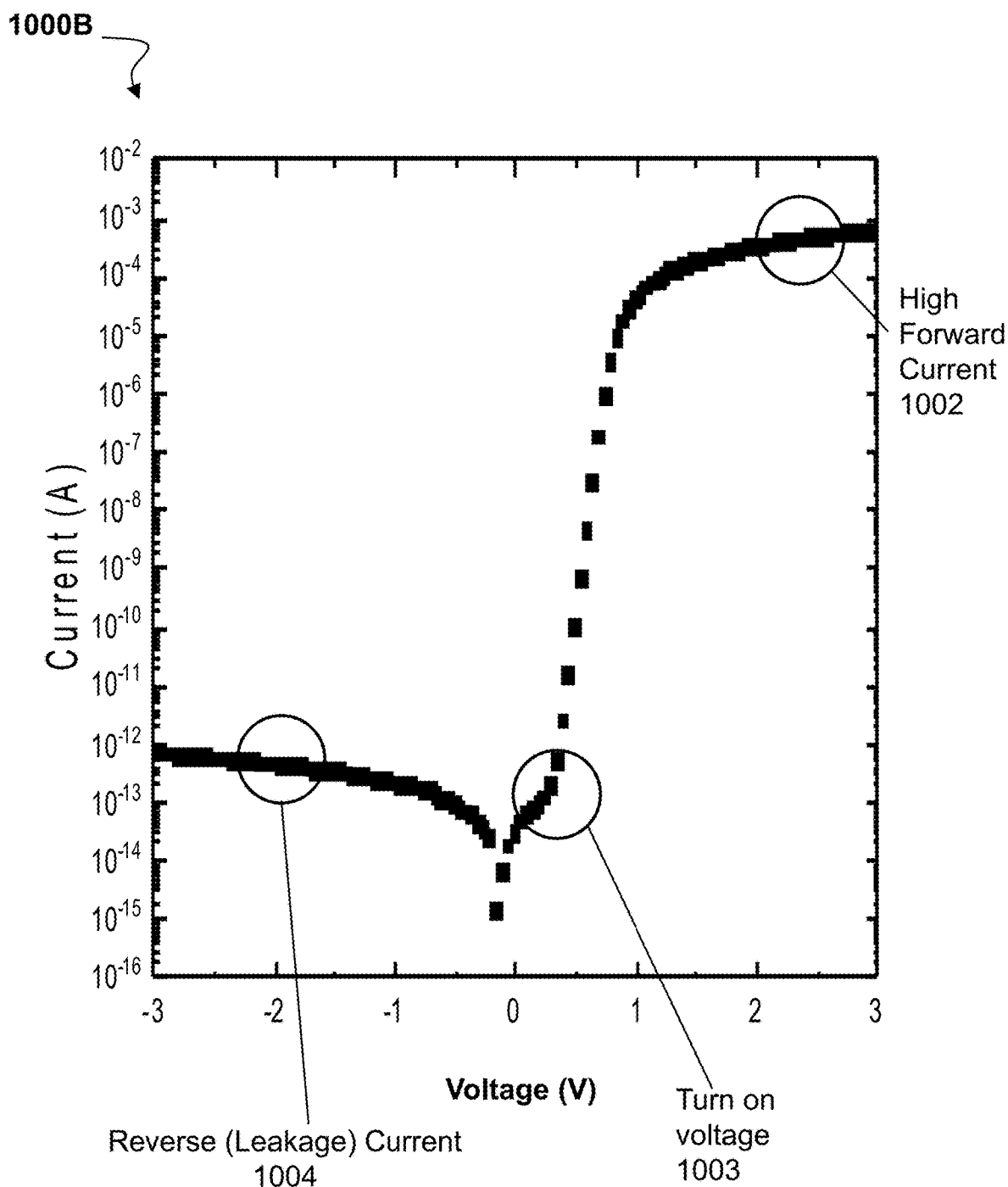
Figure 10C:
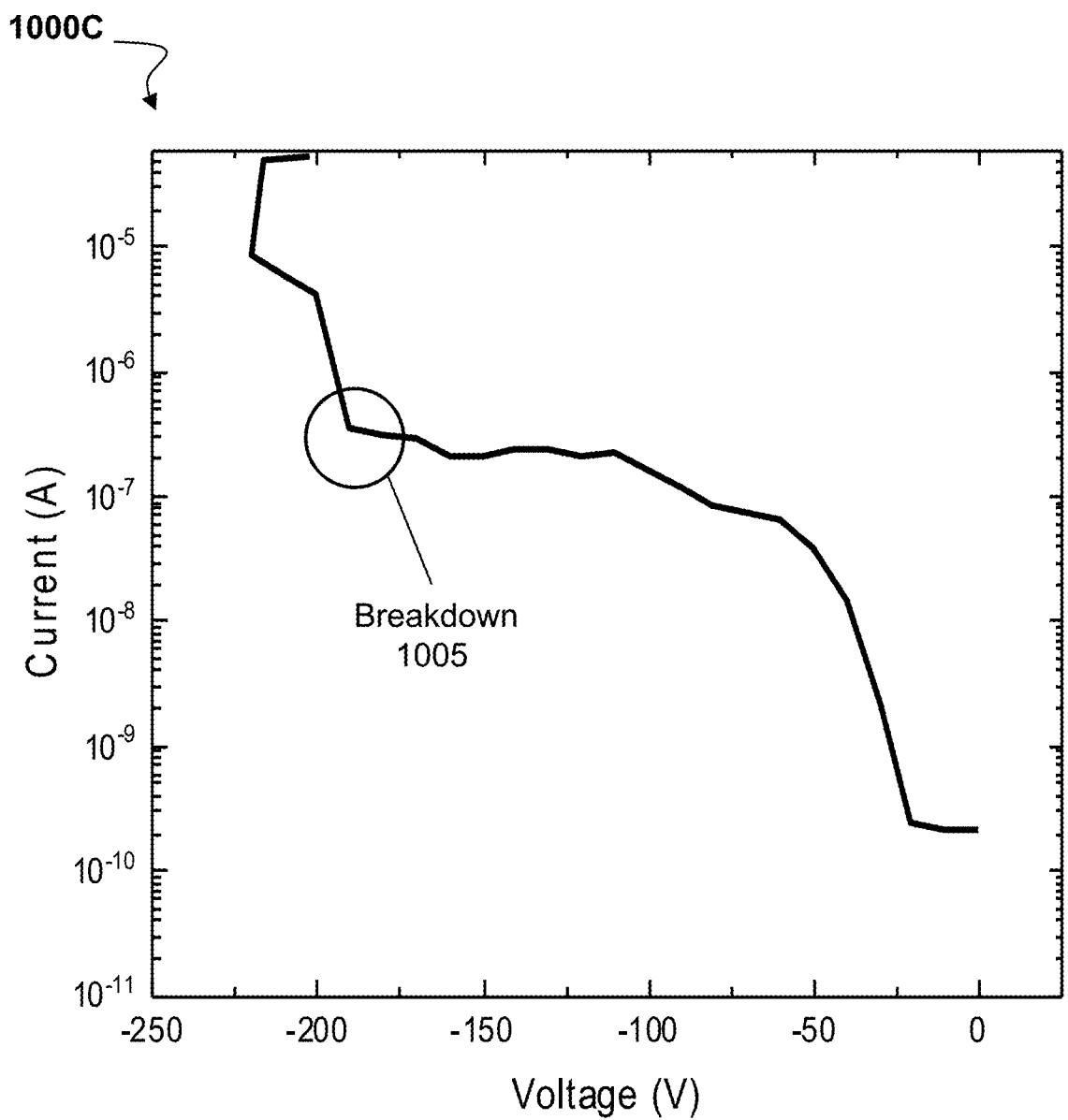

FIGS. 10A-10C further illustrate the advantages of devices formed using the selective-area diffusion doping approach in accordance with the present invention.

The block schematic in FIG. 10A illustrates an exemplary JBS diode such as that described above with respect to FIG. 7A, in which the diode experiences a low forward voltage turn on and thus low power losses from the Schottky diode regions while maintaining a low breakdown current and higher breakdown voltage from the P-N diode regions which shield the Schottky junction from high fields. The high forward current 1002, low turn on voltage 1003, and high on/off rectification ratio (forward current 1002÷reverse current 1004) of such a device is shown by the plot 1000B in FIG. 10B, while the plot 1000C in FIG. 10C shows the breakdown behavior of such a device, showing sharp breakdown at high voltage at 1005 for this diode.

The electrical results shown by the plot in FIG. 9B show current versus voltage for circular transmission length measurements (CTLM) in a material layer having a P-type region formed in accordance with the present invention. The symmetric behavior is a strong indicator of the presence of a P-type material layer in the device. Material analysis such as XPS also indicates the presence of Mg to form a P+ layer in the GaN film as illustrated by the plot in FIG. 8. Electrical test structures, shown schematically in FIG. 10A, have validated P-type conductivity and have shown that a JBS diode having P+ regions formed in accordance with the present invention as described above has less leakage current, shown in FIG. 10C, than the Schottky diode due to the presence of the P-type regions, which deplete under reverse bias to protect the Schottky contact (FIG. 7B). The diffused dopant depth in the JBS diode examined for these plots is <10× the thickness of the initial source film, but could be controlled by selection of appropriate temperature and time.

Advantages and New Features

The main new feature introduced by the present invention is the demonstration of a diffusion process for shallow, selective-area doping suitable for contact formation. This method allows preservation of pristine material using this low damage process which does not introduce unintentional damage or impurities at interfaces. It furthermore allows for selective area doping without topographic features evident in other methods and without complicated and difficult anneals required to repair ion implantation damage further simplifying device processing.

This process can be readily integrated with ion implantation/annealing or epitaxial growth techniques to form electrically contactable selective-area junctions. The advantage of this is obvious from the block schematic in FIG. 7B, which shows a junction barrier Schottky (JBS) diode formed by this technique. While a merged PiN Schottky (MPS) diode has been achieved by ion implantation alone, a JBS diode requires a low resistance ohmic contact to the P-type regions and can only be formed by the techniques described here.

Alternatives

The doping profiles described here can be achieved by epitaxial growth alone, but not in a selective-area manner. This cannot be readily achieved by ion implantation alone as dopants readily diffuse at the required activation temperatures. No known technology can simultaneously form a highly doped surface region for contact formation, bulk doping technique for desired electrical properties, and achieve both in a selective area for specific device structure. This full structure minimizes the number of photolithography and annealing steps for low resistance contact formation.

In many embodiments, the base III-N material will be GaN, but the techniques of the present invention can be used to form P− or P+ type areas within N− or P-type material layers of other III-N materials such as AlGaN, AlN, InN, InGaN, InAlN, or InAlGaN.

In some embodiments, Be can be used instead of Mg for P-type dopant diffusion, while or Si or Ge can be used for N− type dopant diffusion. In some embodiments, alloys such as MgN, MgAlN, MgF, MgO, or others known to one skilled in the art can be used to further stabilize the metallic film and facilitate diffusion.

Since the sputtering or evaporation process occurs at room temperature, it is possible to directly pattern the sputtered layers for selective-area doping by lift-off or other methods known to those skilled in the art. The process is also compatible with standard dielectric masks well known in the semiconductor industry.

Thus, the present invention provides a technique for the controlled diffusion of P− or N− type dopants into a base material layer via deposition of a dopant source material layer, capping of the dopant source layer, and annealing of the capped material to diffuse the dopants into the base material, with the depth and dopant concentration being controllable via control of the initial dopants and the annealing conditions Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for selectively forming at least one P-type area in an N-type material layer, comprising:
    selectively depositing a P-type dopant source material layer onto only at least one predefined doping area of the N-type material layer to be doped;
    depositing a cap layer of a thermally stable material on an upper surface of the P-type dopant source material layer, thereby forming a capped P-type dopant source material layer; and
    annealing the N-type material layer with the capped P-type dopant source material layer to diffuse P-type dopants from the dopant source material into the at least one predefined doping area of the N-type material layer to be doped, thereby forming at least one predefined P-type area within the N-type material layer;
    wherein at least one of a temperature and a time of the anneal is tuned to produce a predefined depth and/or concentration of P-type dopants in the at least one predefined P-type area within the N-type material layer.

2. The method according to claim 1, wherein the N-type material with the capped P-type dopant source material is annealed by multicycle rapid thermal annealing.

3. The method according to claim 1, wherein the N-type material layer with the capped P-type dopant source material is annealed by symmetric multicycle rapid thermal annealing.

4. The method according to claim 1, wherein the N-type material layer is a III-N material layer.

5. The method according to claim 1, wherein the N-type material layer is GaN.

6. The method according to claim 1, wherein the P-type dopant source material is a Mg- or Be-containing material.

7. The method according to claim 1, wherein the at least one predefined P-type area has a depth of about 1 nm to about 20 nm in the N-type material.

8. The method according to claim 1, wherein the at least one predefined P-type area has a P-type dopant concentration between $10^{16}$ and $10^{21}$ cm$^{-3}$.

9. The method according to claim 1, wherein the forming the at least one predefined P-type area within the N-type material layer occurs without etching the N-type material layer.

10. The method according to claim 1, wherein the cap layer comprises at least one electrode in contact with the at least one predefined P-type area.

11. A method for selectively forming at least one P+ area in a P-type material layer, comprising:
    selectively depositing a P-type dopant source material layer onto only at least one predefined doping area of the P-type material layer to be doped;
    depositing a cap layer of a thermally stable material on an upper surface of the P-type dopant source material layer, thereby forming a capped P-type dopant source material layer; and
    annealing the P-type material layer with the capped P-type dopant source material layer to diffuse P-type dopants from the P-type dopant source material into the at least one predefined doping area of the P-type material layer to be doped, thereby forming at least one predefined P+ doped area within the P-type material layer;
    wherein at least one of a temperature and a time of the anneal is tuned to produce a predefined depth and/or concentration of P-type dopants in the at least one predefined P+ doped area within the P-type material layer.

12. The method according to claim 11, wherein the P-type material layer with the capped P-type dopant source material is annealed by multicycle rapid thermal annealing.

13. The method according to claim 11, wherein the P-type material layer with the capped P-type dopant source material is annealed by symmetric multicycle rapid thermal annealing.

14. The method according to claim 11, wherein the P-type material layer is a III-N material layer.

15. The method according to claim 11, wherein the P-type material layer is GaN.

16. The method according to claim 11, wherein the P-type dopant source material is a Mg- or Be-containing material.

17. The method according to claim 11, wherein the at least one predefined P+ area has a depth of about 1 nm to about 20 nm in the P-type material.

18. The method according to claim 11, wherein the at least one predefined P+ area has a P-type dopant concentration between $10^{19}$ and $10^{21}$ cm$^{-3}$.

19. The method according to claim 11, wherein the forming the at least one predefined P+ doped area within the P-type material layer occurs without etching the P-type material layer.

20. The method according to claim 11, wherein the cap layer comprises at least one electrode in contact with the at least one predefined P+ doped area.

* * * * *